United States Patent
Zhang et al.

(10) Patent No.: US 10,643,845 B2
(45) Date of Patent: May 5, 2020

(54) REPAIRED MASK STRUCTURES AND RESULTANT UNDERLYING PATTERNED STRUCTURES

(71) Applicant: GLOBALFOUNDRIES INC., Grand Cayman (KY)

(72) Inventors: Xunyuan Zhang, Albany, NY (US); Ruilong Xie, Niskayuna, NY (US); Yi Qi, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 27 days.

(21) Appl. No.: 15/860,161

(22) Filed: Jan. 2, 2018

(65) Prior Publication Data
US 2019/0206682 A1 Jul. 4, 2019

(51) Int. Cl.
*H01L 21/033* (2006.01)
*H01L 21/02* (2006.01)

(52) U.S. Cl.
CPC ...... *H01L 21/0335* (2013.01); *H01L 21/0262* (2013.01); *H01L 21/02488* (2013.01); *H01L 21/02532* (2013.01); *H01L 21/02636* (2013.01); *H01L 21/02639* (2013.01); *H01L 21/0332* (2013.01)

(58) Field of Classification Search
None
See application file for complete search history.

(56) References Cited

U.S. PATENT DOCUMENTS

| | | | | |
|---|---|---|---|---|
| 6,090,507 A | * | 7/2000 | Grenon | B23K 26/0624 430/5 |
| 8,946,782 B2 | | 2/2015 | Chang et al. | |
| 9,023,688 B1 | | 5/2015 | Or-Bach | |
| 2012/0305525 A1 | | 12/2012 | Lee et al. | |
| 2013/0052769 A1 | | 2/2013 | Luch | |
| 2015/0084122 A1 | * | 3/2015 | Takaishi | H01L 29/66666 257/330 |
| 2015/0261085 A1 | * | 9/2015 | Chu | G03F 1/72 430/5 |

(Continued)

FOREIGN PATENT DOCUMENTS

| | | |
|---|---|---|
| CN | 103208455 | 7/2013 |
| JP | 2012129269 | 7/2012 |

(Continued)

OTHER PUBLICATIONS

German Office Action in related DE Application No. 10 2018 203 377.3 dated Oct. 23, 2018, 4 pages.

(Continued)

*Primary Examiner* — Allan W. Olsen
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to cut margin structures and methods of manufacture. The method includes: forming a plurality of patterned hardmask stacks containing at least a semiconductor layer and a capping layer; removing a portion of a first patterned hardmask stack and a margin of an adjacent hardmask stack of the plurality of the patterned hardmask stacks; and selectively growing material on the margin of the adjacent hardmask stack.

18 Claims, 10 Drawing Sheets

(56) References Cited

U.S. PATENT DOCUMENTS

2016/0238928 A1* 8/2016 Huang ................. G03F 1/74

FOREIGN PATENT DOCUMENTS

KR     1020120092955     8/2012
TW     200828408     7/2008

OTHER PUBLICATIONS

Taiwanese Office Action and Search Report in related TW Application No. 107106372 dated Oct. 25, 2018, 4 pages.
Taiwanese Notice of Allowance and Search Report in related TW Application No. 107106372 dated Apr. 12, 2019, 4 pages.
Tsai et al., "Advanced Patterning Approaches for Cu/Low-k interconnects", Interconnect Development Department I, Backend Path finding, R & D, Taiwan Semiconductor Manufacturing Co., Ltd., Jan. 5, 2017, 3 pages.

* cited by examiner

REPAIRED MASK STRUCTURES AND RESULTANT UNDERLYING PATTERNED STRUCTURES

FIELD OF THE INVENTION

The present disclosure relates to semiconductor structures and, more particularly, to repaired mask structures and resultant patterned structures and methods of manufacture.

BACKGROUND

In semiconductor fabrication, semiconductor chips are fabricated together on a single wafer. Fabrication of these chips generally involves forming several different structures on the wafer, including wiring lines, active devices and passive devices. These structures can be fabricated using conventional lithography, etching and deposition processes.

Scaling in semiconductor fabrication can be problematic, though, particularly beyond the 10 nm node. For example, in copper damascene processes, grain growth is constrained by narrow trenches into which copper is deposited. However, as pitch size is continually shrinking (e.g., coming closer together), it is becoming ever more difficult to pattern, e.g., cut, the metal lines or other structures in subsequent fabrication processes. For example, with the shrunken pitches, cutting of metal lines may damage neighboring metal lines, particularly since there is no self-aligned scheme available after self-aligned double patterning (SADP) or self-aligned quadruple patterning (SAQP).

SUMMARY

In an aspect of the disclosure, a method comprises: forming a plurality of patterned hardmask stacks containing at least a semiconductor layer and a capping layer; removing a portion of a first patterned hardmask stack and a margin of an adjacent hardmask stack of the plurality of the patterned hardmask stacks; and selectively growing material on the margin of the adjacent hardmask stack.

In an aspect of the disclosure, a method comprises: forming a stack of material comprising semiconductor material sandwiched between hardmask layers; patterning portions of the semiconductor material and the hardmask layer above the semiconductor material to form a plurality of masks; etching a pattern into the semiconductor material and the hardmask material above the semiconductor material of a first mask and an edge portion of an adjacent mask of the plurality of masks; growing material at the semiconductor material of the adjacent mask at the edge to repair the adjacent mask; and transferring the pattern of the first mask and the repaired adjacent mask to the hardmask layer underlying the semiconductor material.

In an aspect of the disclosure, a structure, comprises: a first patterned mask with a cut feature comprising: a first hardmask material on underlying material; a first semiconductor material on the first hardmask material; capping material on the semiconductor material; and a second patterned mask adjacent to the first patterned mask, comprising: the first hardmask material; the first semiconductor material and a second semiconductor material on the first hardmask material; and the capping material on the first semiconductor material and the second semiconductor material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to repaired mask structures and resultant patterned structures using the mask structures and methods of manufacture. More specifically, the present disclosure relates to masks which are used to fabricate metal line features (or other structures) that will not exhibit margin cuts when using subtractive etch patterning processes. In embodiments, the present disclosure is also directed to the structures, themselves, e.g., metal lines, fin structures and/or gate structures, which do not exhibit margin cuts that may otherwise occur during conventional patterning processes.

Accordingly and advantageously, the present disclosure provides a solution to line cut margin challenges for self-aligned double patterning (SADP) or self-aligned quadruple patterning (SAQP). The methods and resulting structures described herein can also be implemented in further scaled technology nodes when using an extreme ultraviolet lithography (EUV) mask to perform SADP.

For example, in embodiments, the processes described herein use a selective growth material, e.g., SiGe, to repair a hardmask which may occur due to misalignment of the photoresist opening. In embodiments, the hardmask can comprise polysilicon, amongst other hardmask materials; although other materials are contemplated herein. In embodiments, selective SiGe growth can be provided at low temperatures needed in back end of the line processes. For example, the selective SiGe growth can occur at temperatures <400° C. and, more specifically at low temperatures of approximately 375° C. or below. This is possible due to the use of source gases of $Si_2H_6$ and $Ge_2H_6$. In embodiments, the low temperature SiGe growth is only required for BEOL metal processes, as other implementations described herein (e.g., fin cut and gate cut processes) do not require such low temperatures. The repaired mask features can then be used to pattern underlying features, e.g., line cuts, fin structures, etc., which avoid line cut margin errors in such underlying structures, which could otherwise occur during patterning processes in conventional processes.

The cut margin structures (e.g., masks and patterned semiconductor features) of the present disclosure can be manufactured in a number of ways using a number of different tools. In general, though, the methodologies and tools are used to form structures with dimensions in the micrometer and nanometer scale. The methodologies, i.e., technologies, employed to manufacture the cut margin structures of the present disclosure have been adopted from integrated circuit (IC) technology. For example, the cut margin structures are built on wafers and are realized in films of material patterned by photolithographic processes on the top of a wafer. In particular, the fabrication of the cut margin structures uses three basic building blocks: (i) deposition of thin films of material on a substrate, (ii) applying a patterned mask on top of the films by photolithographic imaging, and (iii) etching the films selectively to the mask.

Figure 1:
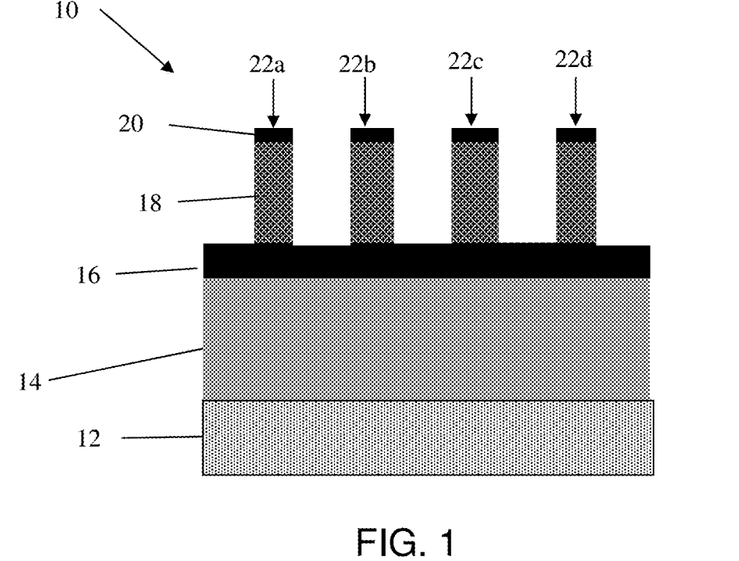
FIG. 1 shows a structure and respective fabrication processes in accordance with aspects of the present disclosure.

FIG. 1 shows a structure and respective fabrication processes in accordance with aspects of the present disclosure. In embodiments, the structure 10 includes a metal material 14 formed on an underlying insulator material 12. In embodiments, the metal material 14 can be any conductive material such as, e.g., copper, aluminum, etc. The insulator material 12 can be any interlevel dielectric material, e.g., oxide material. The metal material 14 can be deposited on the insulator material 12 using any conventional deposition process, e.g., chemical vapor deposition (CVD) processes.

Still referring to FIG. 1, a hardmask stack of material is deposited on the metal material 14. In embodiments, the hardmask stack comprises a first hardmask material 16 (e.g., SiN), a semiconductor material 18 (e.g., poly material) and a capping layer 20, (e.g., SiN). It should be understood by those of skill in the art that the capping layer 20 is also a hardmask. The materials 16, 18, 20 can be deposited using conventional CVD processes. In embodiments, the materials 18 and 20 are subjected to a patterning process using conventional line patterning, e.g., SADP or SAQP, resulting in individual line cut masks 22a, 22b, 22c, 22d (e.g., patterned masks).

Figure 2:
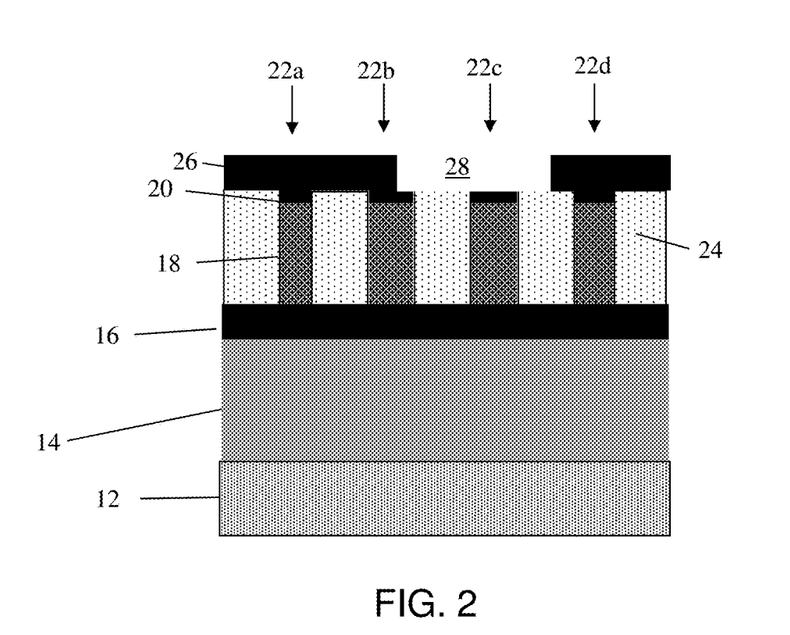
FIG. 2 shows an insulator material within spaces between individual line cut masks, amongst other features, and respective fabrication processes in accordance with aspects of the present disclosure.

As shown in FIG. 2, an insulator material 24 is deposited within the spaces between the individual line cut masks 22a, 22b, 22c, 22d, followed by an etch back and/or chemical mechanical polishing (CMP). In embodiments, the insulator material 24 can be any interlevel dielectric material such as an oxide material deposited by a conventional deposition process, e.g., CVD. A photoresist material (e.g., mask) 26 is formed over the insulator material 24. The photoresist material 26 is exposed to energy (light) to form a pattern (opening) 28. In embodiments, the opening 28 of the photoresist material 26 is aligned with line cut mask 22c and partially overlaps line cut mask 22b due to the narrow pitch of the lines 22b, 22c. Accordingly, as one of skill in the art would readily understand, the photoresist material 26 has an overlay error.

Figure 3:
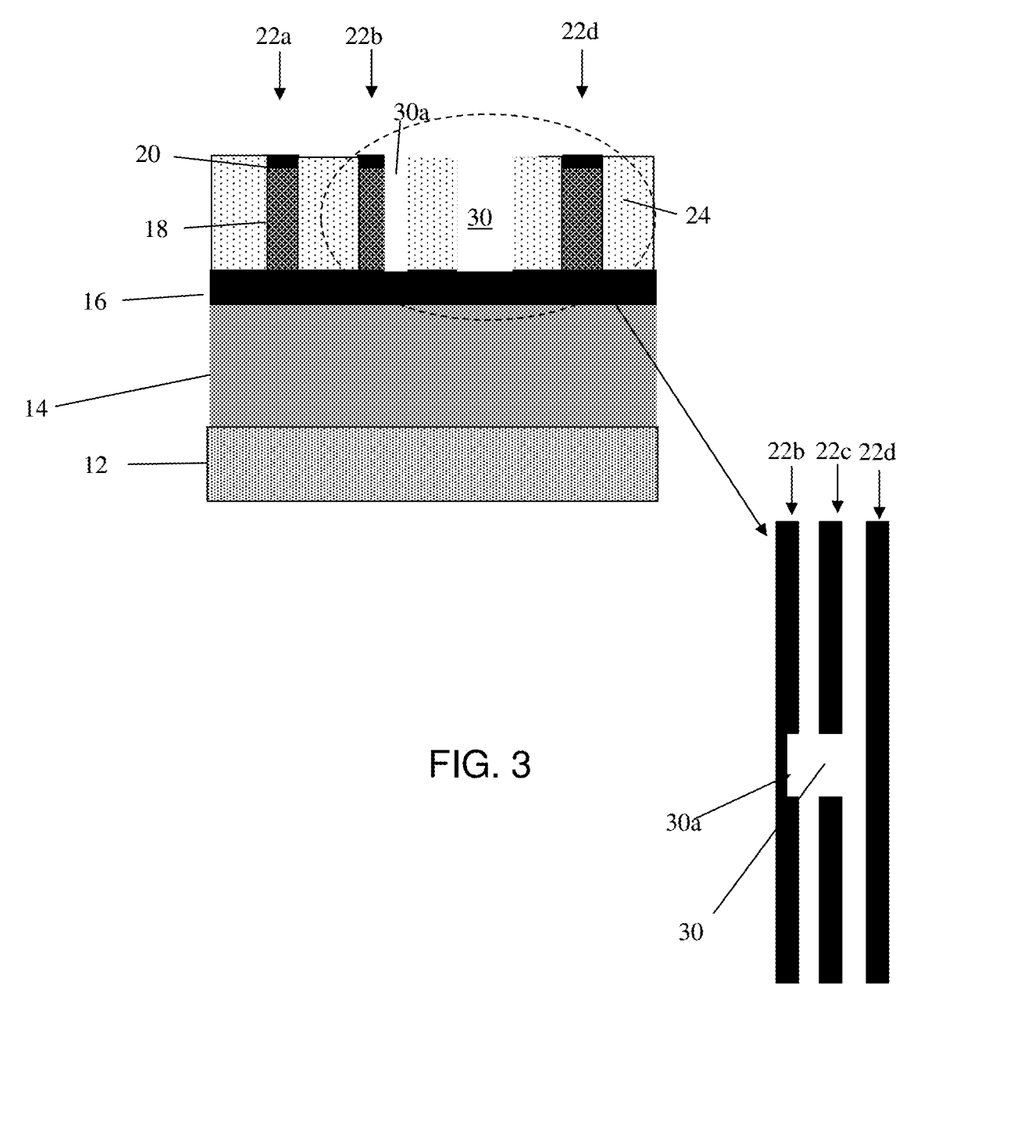
FIG. 3 shows a cross-sectional view and top view of a pattern error of a line cut mask, amongst other features, and respective fabrication processes in accordance with aspects of the present disclosure.

In FIG. 3, the structure undergoes an etching process to remove a portion of line cut mask 22c, thereby forming a trench or cut 30 between remaining portions of the line cut mask 22c. In embodiments, the etching process will also partially remove a side or edge portion of the adjacent line cut mask 22b due to the overlay error, resulting in a narrower portion of the line cut mask 30a at the edge thereof, e.g., forming a space between the line cut mask 22b and the insulator material 24. In embodiments, the etching process includes a selective chemistry, e.g., reactive ion etching (RIE), to the material of the lines 22b, 22c, e.g., material 18, 20. The resist can then be removed by a conventional oxygen ashing process or other known stripants.

Figure 4:
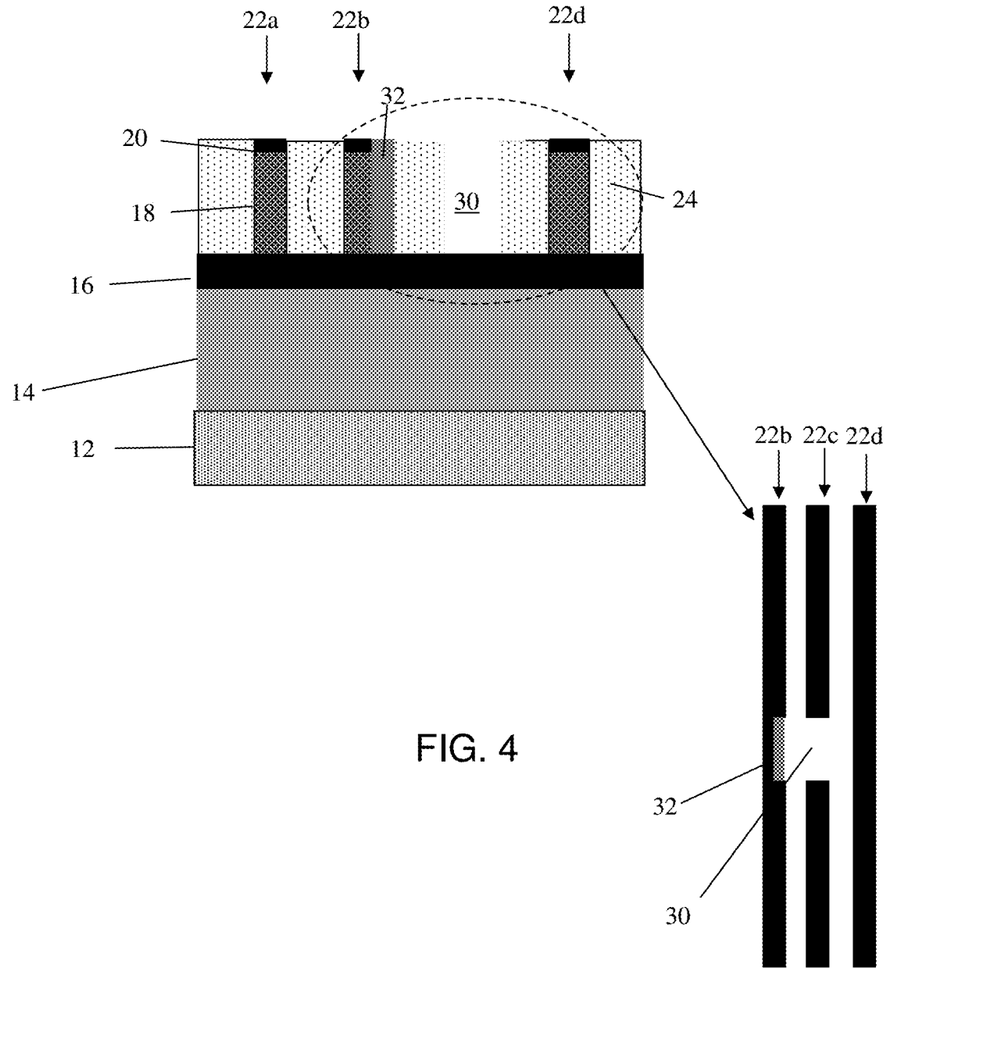
FIG. 4 shows a cross-sectional view and top view of an epitaxial material on the pattern error, amongst other features, and respective fabrication processes in accordance with aspects of the present disclosure.

As shown in FIG. 4, following the resist removal, a selective growth material 32 is grown on the exposed, narrowed side or edge of the line cut mask 22b. In embodiments, the selective growth material 32 is an epitaxial semiconductor material, e.g., SiGe, which grows on the semiconductor material 18, e.g., polysilicon. As should be understood by those of ordinary skill in the art, the selective growth material 32 will fill in the space 30a, making it part of the line cut mask 22b and resulting in repairing the line cut mask 22b to its original pattern (width dimension), e.g., filling in the cut of the formed in the line cut mask 22b caused by the previous etching process. In embodiments, the selective SiGe growth can occur at temperatures <400° C. and, more specifically at low temperatures of approximately 375° C. or below. This is possible due to the use of source gases of $Si_2H_6$ and $Ge_2H_6$.

Figure 5:
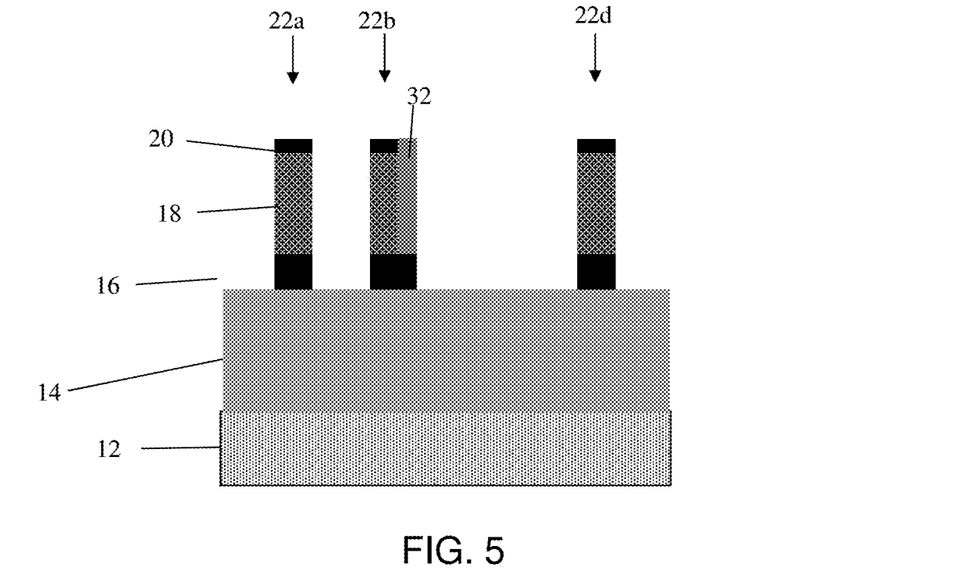
FIG. 5 shows further patterning of individual line cut masks, amongst other features, and respective fabrication processes in accordance with aspects of the present disclosure.

In FIG. 5, the insulator material 24 is removed using conventional etching processes, e.g., RIE, using a chemistry that is selective to removal of oxide material. Following the removal of the insulator material, the pattern of the line cut masks 22a, 22b, 22c, 22d is transferred to the masking material 16. As shown in FIG. 5, due to the selective growth material 32 on the side of the line cut mask 22b, the entire pattern width can be transferred into the line cut mask 22b, now comprising the materials 16, 18, 20, 32.

Figure 6:
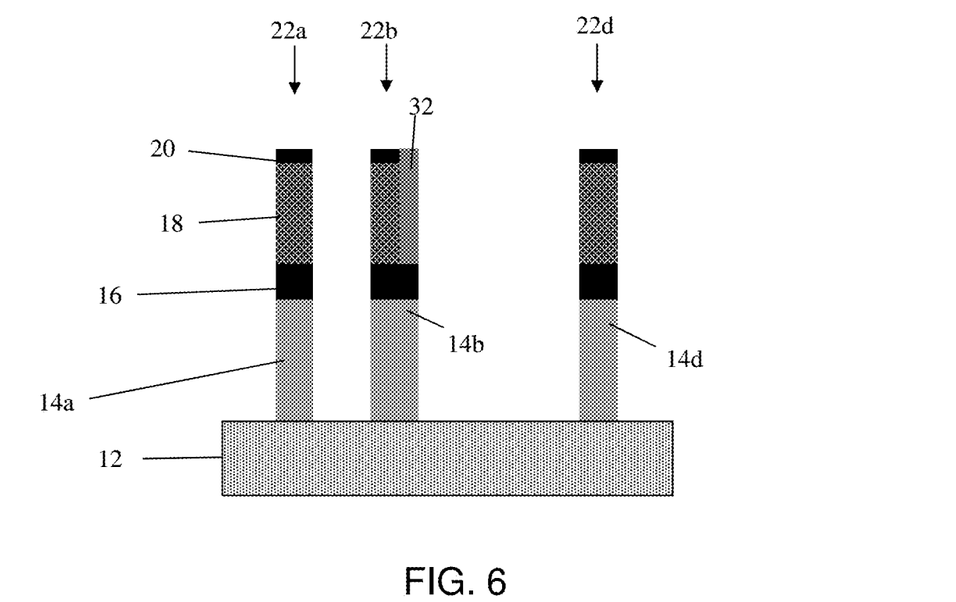
FIG. 6 shows cut metal lines, amongst other features, and respective fabrication processes in accordance with aspects of the present disclosure.

FIG. 6 shows a metal etching process to form metal lines 14a, 14b, 14c, 14d. In embodiments, the pattern of the line cut masks 22a, 22b, 22c, 22d is transferred to the metal material 14, resulting in metal lines 14a, 14b, 14d (with a cut in line 14c as shown representatively in the top view of FIG. 7). The patterning process is a conventional etching processes, e.g., RIE, using a chemistry that is selective to removal of material 14. As should now be appreciated, none of the metal lines 14a, 14b, 14c will have any margin cuts or overlay errors due to the processed described herein.

Figure 7:
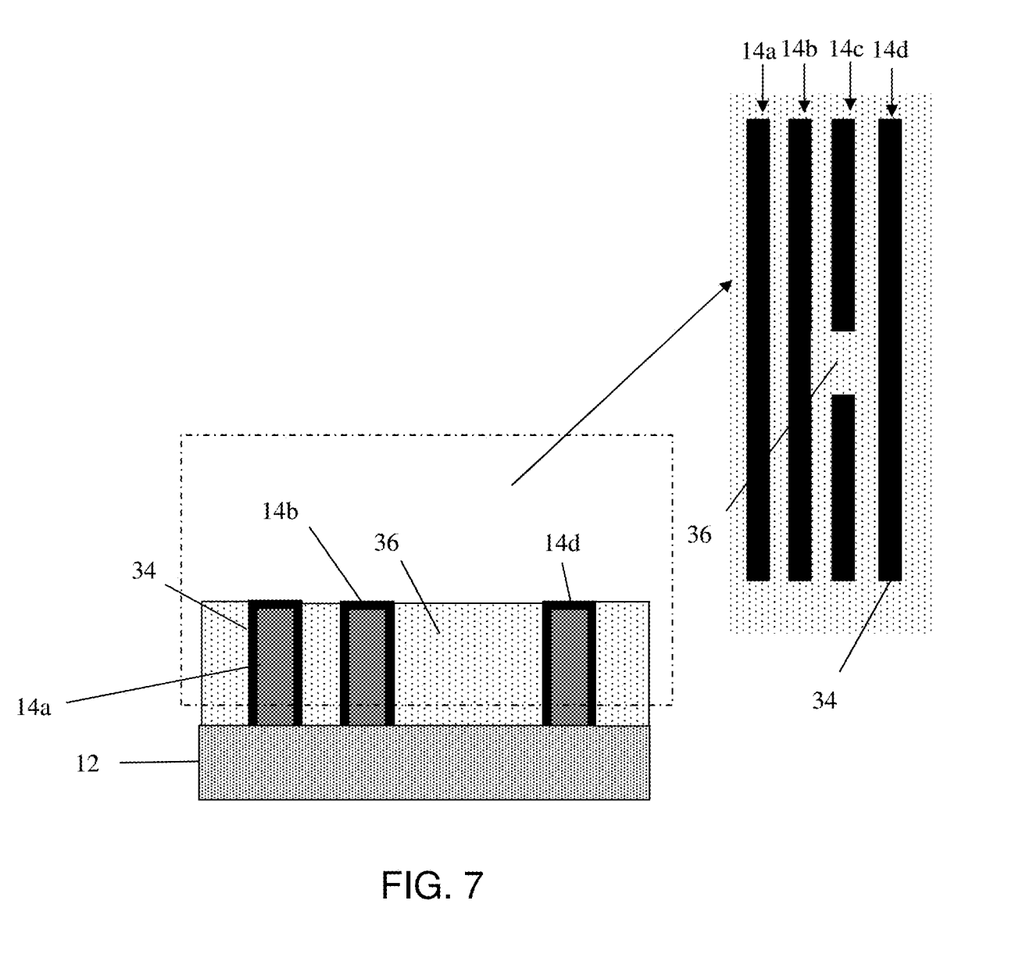
FIG. 7 shows a cross-sectional view and top view of insulator material over the metal lines, amongst other features, and respective fabrication processes in accordance with aspects of the present disclosure.

In FIG. 7, following the removal of the line cut masks 22a, 22b, 22c, 22d, a barrier layer 34 can be deposited over the metal lines 14a, 14b, 14c, 14d. In embodiments, the barrier layer 34 is an insulating barrier layer such as nitride. An insulator material 36 is deposited on the barrier layer 34, followed by a CMP process. In embodiments, the insulator material 36 can be any low-k dielectric material, e.g., interlevel dielectric material.

FIGS. 8-11 show fin cuts, amongst other features, and respective fabrication processes in accordance to aspects of the present disclosure. The process steps shown in FIGS. 8-11 are similar to that shown in FIGS. 1-7; however, instead of an underlying metal material, FIGS. 8-11 show an underlying semiconductor material 38 used to form fin structures (including a cut fin structure). In particular, in FIG. 8, the structure 10' includes a semiconductor material 38, which may be composed of any suitable material including, but not limited to, Si, SiGe, SiGeC, SiC, GaAs, InAs, InP, and other III/V or II/VI compound semiconductors.

Figure 8:
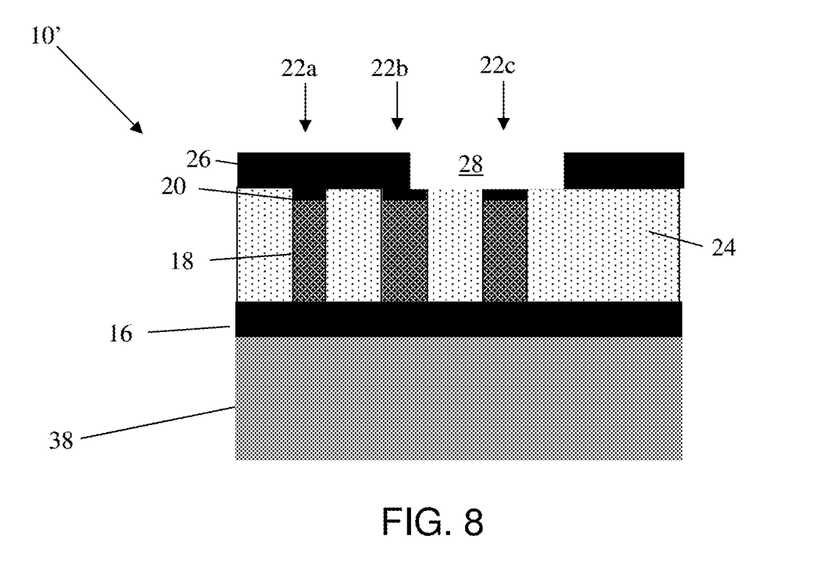
FIGS. 8-11 show fin cuts, amongst other features, and respective fabrication processes in accordance to aspects of the present disclosure.

A hardmask stack is deposited on the metal material. In embodiments, the hardmask stack comprises the first hardmask material 16 (e.g., SiN), the semiconductor material 18 (e.g., poly material) and another hardmask material 20 (e.g., SiN). The materials 16, 18, 20 can be deposited using conventional CVD processes. The materials 18 and 20 are subjected to a patterning process using conventional line patterning, e.g., SADP or SAQP, resulting in individual line cut masks 22a, 22b, 22c. An insulator material 24 is deposited within the spaces between the individual line cut masks 22a, 22b, 22c, followed by an etch back and/or chemical mechanical polishing (CMP). In embodiments, the insulator material 24 can be any interlevel dielectric material such as an oxide material deposited by a conventional deposition process, e.g., CVD.

Still referring to FIG. 8, a photoresist material (e.g., mask) 26 is formed over the insulator material 24. The mask 26 is exposed to energy (light) to form a pattern (opening) 28. In embodiments, the opening 28 is aligned with line cut mask 22b and partially overlaps line cut mask 22a due to the narrow pitch of the masks 22a, 22b. Accordingly, as one of skill in the art would readily understand, the mask 26 has an overlay error.

The structure undergoes an etching process to remove a portion of line cut mask 22b, thereby forming a trench or cut 30 between remaining portions of the line cut mask 22b. In embodiments, the etching process will also partially remove a side or edge portion of the line cut mask 22a due to the overlay error, resulting in a narrower line cut mask 30a at the edge thereof, e.g., forming a space between the line cut mask 22b and the insulator material 24. In embodiments, the etching process with a selective chemistry, e.g., reactive ion etching (RIE), to the material of the lines 22b, 22c, e.g., material 18, 20. The resist can then be removed by a conventional oxygen ashing process or other known stripants.

Figure 9:
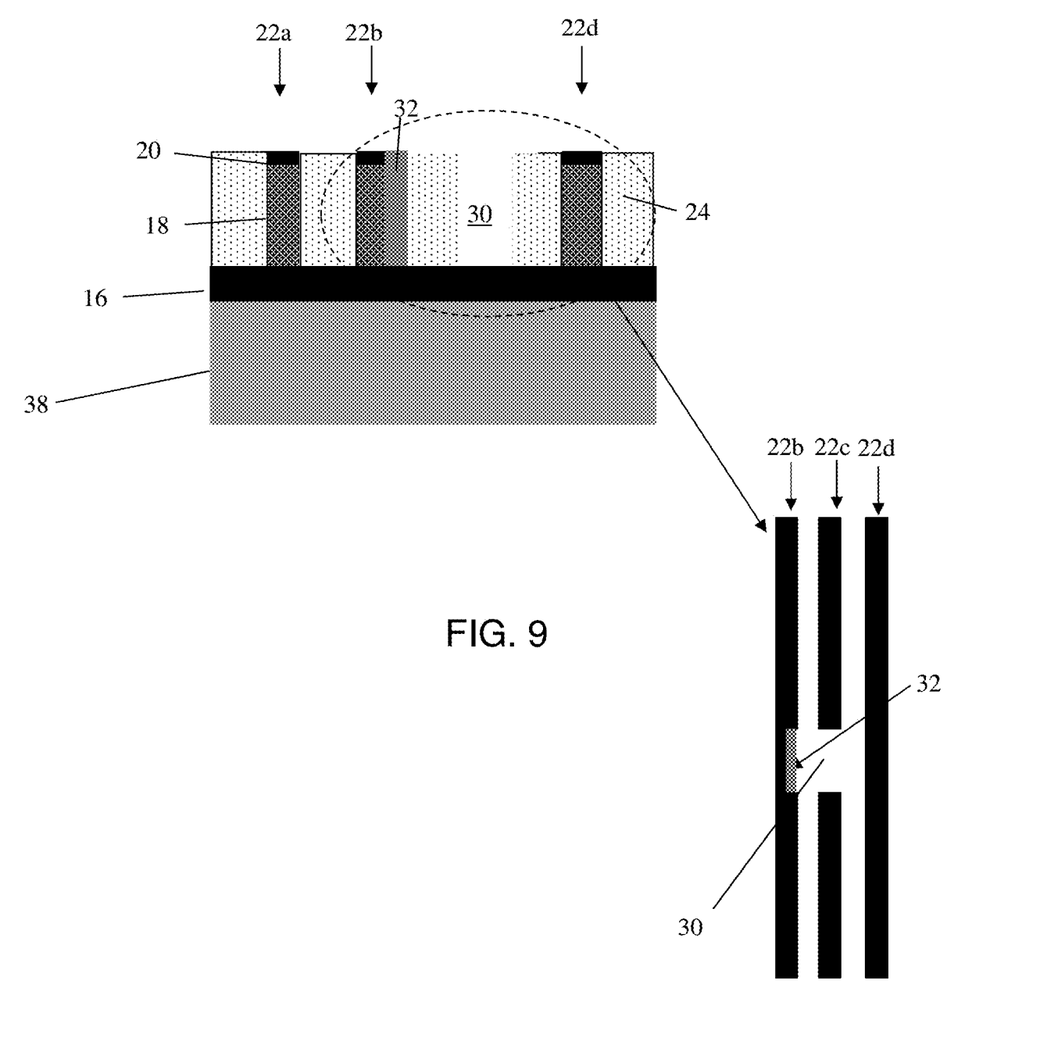

As shown in FIG. 9, following the resist removal, a selective growth material 32 is grown on the narrowed side or edge of the line cut mask 22a. In embodiments, the selective growth material 32 is SiGe which grows on the semiconductor material 18, e.g., polysilicon, which will fill in the space 30a, making it part of the line cut mask 22a and resulting in repairing the line cut mask 22a to its original width (dimension). In embodiments, the selective SiGe growth can occur at temperatures above 400° C. Alternatively, the selective SiGe growth can occur at temperatures below 400° C., as described above.

Figure 10:
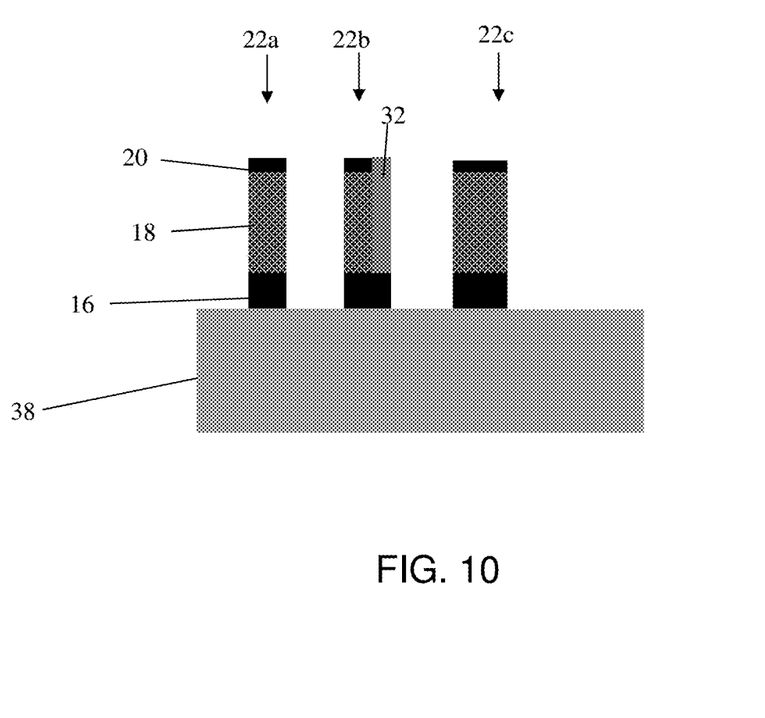

In FIG. 10, the insulator material 24 is removed using conventional etching processes, e.g., RIE, using a chemistry that is selective to removal of oxide material. Following the removal of the insulator material, the pattern of the line cut mask 22a, remaining portions of line cut mask 22b, and line cut mask 22c is transferred to the masking material 16. As shown in FIG. 10, due to the selective growth material 32 on the side of the line cut mask 22b, the entire pattern width can be transferred into the line cut mask 22a, now comprising the materials 16, 18, 20, 32.

Figure 11:
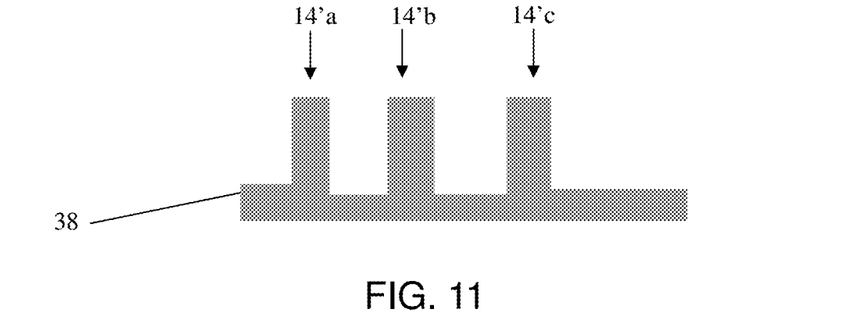

FIG. 11 shows a semiconductor etching process to form fins lines 14'a, 14b', 14'c. In embodiments, the pattern of the line cut masks 22a, 22b, 22d is transferred to the semiconductor material 38, resulting in metal lines 14'a, 14'b, 14'c. The patterning process is a conventional etching processes, e.g., RIE, using a chemistry that is selective to removal of material 38. As should now be appreciated, the fins 14'a, 14'b, 14'c will not have any cuts or overlay errors due to the processed described herein. Any masking material can now be removed using conventional stripants.

FIGS. 12-16 show gate cuts, amongst other features, and respective fabrication processes in accordance with aspects of the present disclosure. In embodiments, the structure 10'' includes dummy gate structures 40 composed of, e.g., sacrificial material. The dummy gate structures 40 can be formed over fin structures or substrate material 41 (hereinafter fin structures), for example. The dummy gate structures 40 include sidewall spacers 42, e.g., low k-dielectric material. The dummy gate structures 40 and sidewall spacers 42 can be formed using conventional CMOS technologies, e.g., deposition and patterning, such that no further explanation is required for a person of ordinary skill to understand the present embodiment. Epitaxial source/drain regions 44 are provided adjacent to the dummy gate structures 40, in the fin structures 41. Insulator material 46, e.g., is provided between the dummy gate structures 40. The insulator material 46 can be any interlevel dielectric material, e.g., oxide based materials, deposited using a conventional CVD process.

Figure 12:
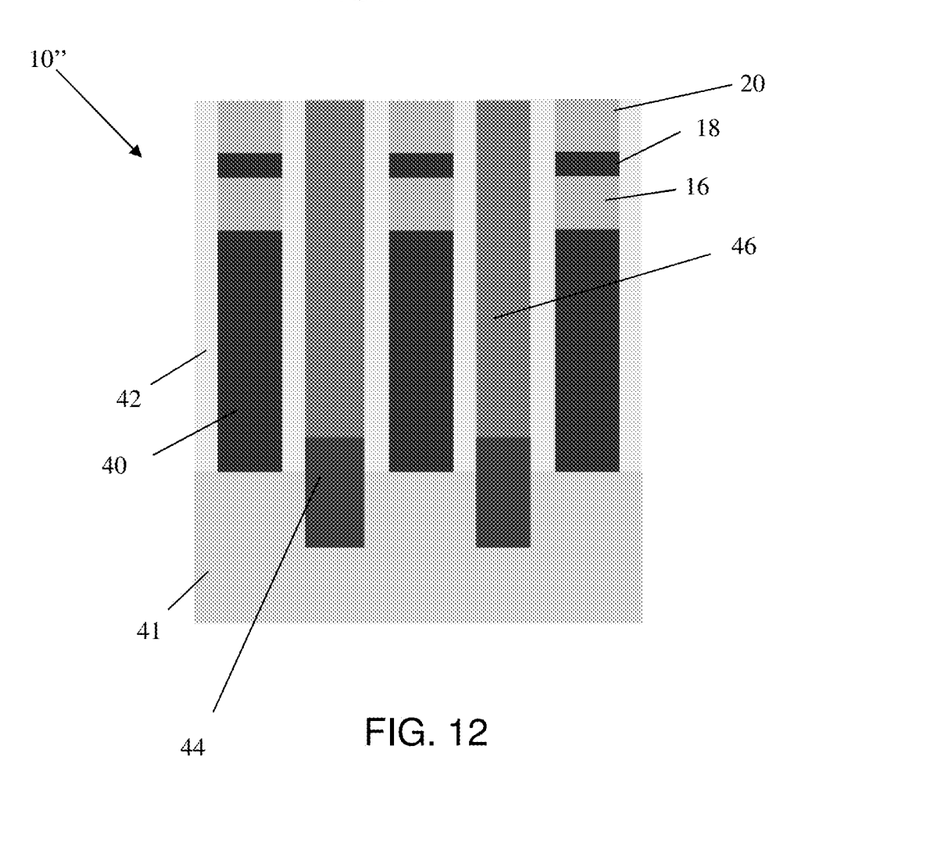
FIGS. 12-16 show gate cuts, amongst other features, and respective fabrication processes in accordance to aspects of the present disclosure.

Similar to that already described, a hardmask material 16, (e.g., SiN), semiconductor material 18 (e.g., poly material) and another hardmask material 20 (e.g., SiN) can be formed over the dummy gate structures 40. The materials 16, 18, 20 can be deposited using conventional CVD process, followed by a CMP process.

Figure 13:
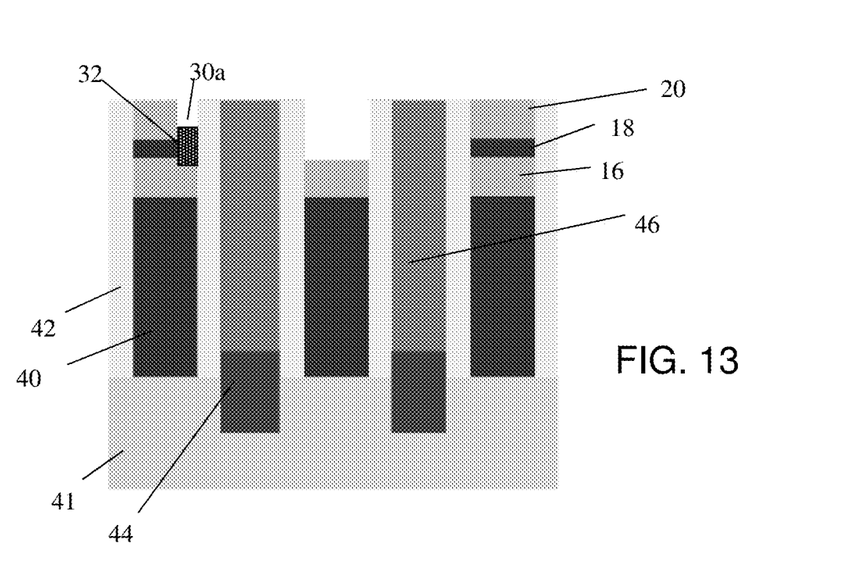

Referring now to FIG. 13, a photoresist material (e.g., mask) is formed over the insulator material 44 and hardmask material 20. The mask is exposed to energy (light) to form a pattern (opening). In embodiments, the opening is aligned with the dummy gate structure 40b, and partially overlaps dummy gate structure 40a due to the narrow pitch of the dummy gate structures. Accordingly, as one of skill in the art would readily understand, the mask has an overlay error. The structure undergoes an etching process to remove a portion of mask material 18, 20 of the dummy gate structure 40b (leaving masking material 16). This etching process also removes a portion of the mask material 18, 20 of the dummy gate structure 40a, due to the overlay error, resulting in a trench or space 30a. In embodiments, the etching process with a selective chemistry, e.g., reactive ion etching (RIE), to the materials 18, 20. The resist can then be removed by a conventional oxygen ashing process or other known stripants.

As shown in FIG. 13, following the resist removal, a selective growth material 32 is grown on the narrowed side or edge of masking material 18 over the dummy gate structure 40a. In embodiments, the selective growth material 32 is an epitaxial semiconductor material, e.g., SiGe, which grows on the semiconductor material 18, e.g., polysilicon, which will fill in the space 30a, making it part of the dummy gate structure 40a and resulting in returning the masking material to its original width (dimension). In embodiments, the selective SiGe growth can occur at temperatures above 400° C. Alternatively, the selective SiGe growth can occur at temperatures below 400° C., as described above.

Figure 14:
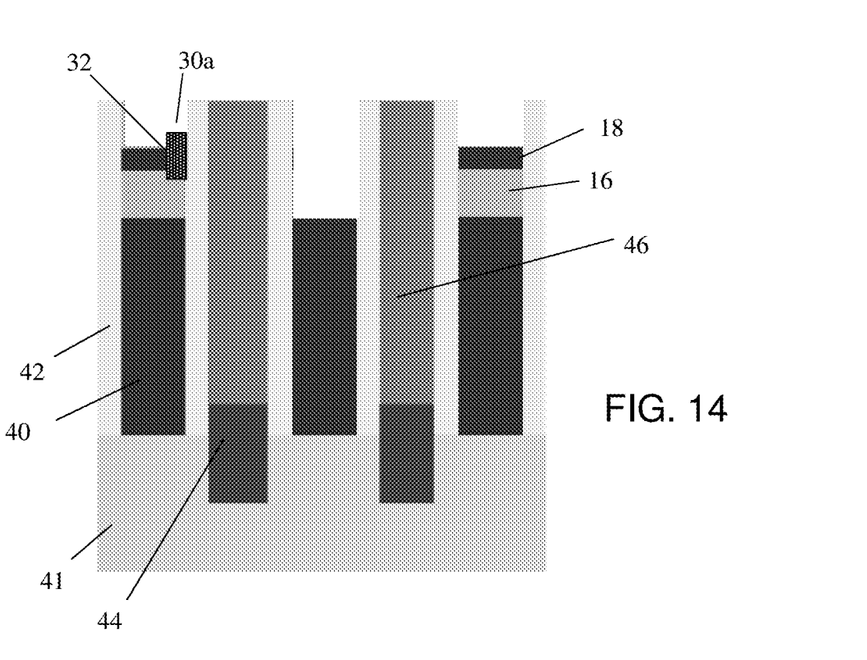

In FIG. 14, masking material 16 over the dummy gate structure 40b is removed using conventional etching processes, e.g., RIE, using a chemistry that is selective to removal of the masking material 16. In this step, the exposed masking material 20 over dummy gate structure 40b will also be removed, leaving the masking material 18 and the selective growth material 32.

Figure 15:
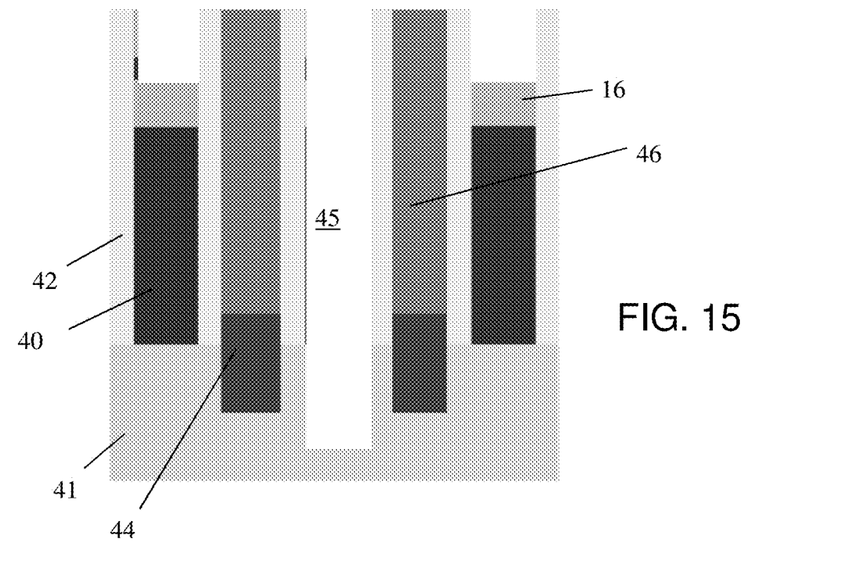

In FIG. 15, a cut in the dummy gate structure 40b, extending into the fin structure 41. In embodiments, the cut is provided by an etching process similar to that already described herein. In this way, a trench or opening 45 is formed between the remaining dummy gate structures 40a, 40c, extending into the fin structure 41. The masking material 18 and the selective growth material 32 can also be removed during the etching process.

Figure 16:
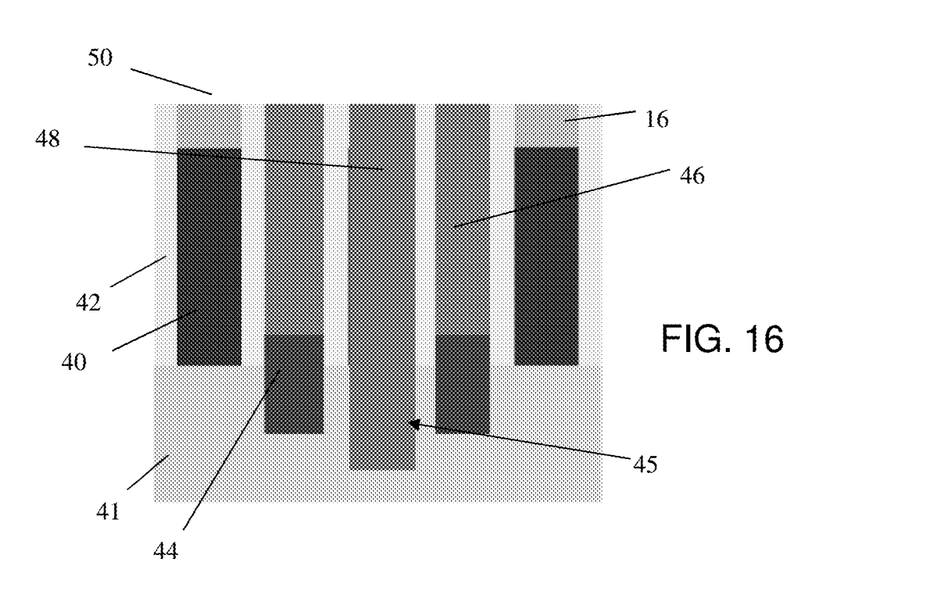

In FIG. 16, an insulator material 48 is deposited within the opening 45. The insulator material 48 can be an oxide material deposited by a conventional deposition process, e.g., CVD. Following the deposition of the insulator material 48, the entire structure can undergo a CMP process to form a planar surface 50. The masking material 18 can remain, acting as a capping material to the dummy gate structures (and any other gate structures).

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
   forming a plurality of patterned hardmask stacks containing at least a semiconductor layer and a capping layer;
   removing a portion of a first patterned hardmask stack and a margin of an adjacent hardmask stack of the plurality of the patterned hardmask stacks; and
   selectively growing material on the margin of the adjacent hardmask stack.

2. The method of claim 1, wherein the material is epitaxial material selectively grown on the semiconductor layer to repair the margin of the adjacent hardmask stack.

3. The method of claim 1, further comprising patterning material underneath plurality of patterned hardmask stacks.

4. The method of claim 3, wherein the patterning is a cut of a metal line.

5. The method of claim 3, wherein the patterning is a cut in a fin structure.

6. The method of claim 3, wherein the patterning is a feature of a gate structure.

7. The method of claim 1, wherein the plurality of patterned hardmask stacks are formed by layering hardmask material on underlying material, the semiconductor layer on the hardmask material and the capping layer above the semiconductor layer, followed by an etching process to remove the portion of the first patterned hardmask stack.

8. The method of claim 7, wherein the etching also removes margin of the adjacent patterned hardmask stack.

9. The method of claim 7, wherein the portion of the first patterned hardmask stack is a cut which is transferred to the underlying material.

10. The method of claim 9, wherein the margin is an edge or side of the adjacent patterned hardmask stack, adjacent to the cut.

11. A method comprising:
    forming a stack of material comprising semiconductor material sandwiched between upper and lower hardmask layers;
    patterning portions of the semiconductor material and the upper hardmask layer to form a plurality of masks;
    etching a first mask pattern into the semiconductor material and the upper hardmask material and etching an edge portion of an adjacent mask of the plurality of masks;
    selectively growing material on the semiconductor material at the etched edge of the adjacent mask to repair the adjacent mask; and
    transferring the pattern of the first mask and the repaired adjacent mask to the lower hardmask layer.

12. The method of claim 11, further comprising transferring the pattern of the plurality of masks including the repaired adjacent mask to a material underlying the stack.

13. The method of claim 12, wherein the underlying material is metal material, and the transferring of the first mask pattern forms at least a cut into a metal line of the metal material.

14. The method of claim 12, wherein the underlying material is fin material, and the transferring of the first mask pattern forms at least a cut into a fin structure of the fin material.

15. The method of claim 12, wherein the underlying material is gate material.

16. The method of claim 12, wherein the material grown on the semiconductor material is epitaxial material.

17. The method of claim 16, wherein the epitaxial material is SiGe.

18. The method of claim 16, wherein the epitaxial material repairs the adjacent mask to its pattern shape, prior to the etching of the pattern.

* * * * *